(12) United States Patent
Gaida

(10) Patent No.: US 7,559,134 B2
(45) Date of Patent: Jul. 14, 2009

(54) PICK AND PLACE MACHINE WITH IMPROVED COMPONENT PLACEMENT INSPECTION

(75) Inventor: John D. Gaida, Victoria, MN (US)

(73) Assignee: CyberOptics Corporation, Golden Valley, MN (US)

( * ) Notice: Subject to any disclaimer, the term of this patent is extended or adjusted under 35 U.S.C. 154(b) by 294 days.

(21) Appl. No.: 10/970,355

(22) Filed: Oct. 21, 2004

(65) Prior Publication Data
US 2005/0117797 A1 Jun. 2, 2005

Related U.S. Application Data

(60) Provisional application No. 60/517,184, filed on Nov. 4, 2003.

(51) Int. Cl.
*B23P 21/00* (2006.01)
(52) U.S. Cl. .............. 29/720; 29/721; 29/740; 29/832; 356/396; 356/602
(58) Field of Classification Search .......... 29/729, 29/739–743, 757–759, 719–721, 832–834, 29/705; 414/737, 752.1; 901/40; 294/64.1; 382/146–151; 716/4; 356/373–375, 396, 356/601, 602, 605, 608, 614, 369
See application file for complete search history.

(56) References Cited

U.S. PATENT DOCUMENTS

| | | | |
|---|---|---|---|
| 3,814,845 A | 6/1974 | Hurlbrink, III et al. | 178/6.8 |
| 4,281,342 A | 7/1981 | Ueda et al. | 348/94 |
| 4,776,088 A | 10/1988 | Biggs et al. | 29/834 |
| 4,809,430 A | 3/1989 | Maryuama et al. | 29/834 |
| 4,825,091 A | 4/1989 | Breyer et al. | 250/559.38 |
| 4,914,513 A | 4/1990 | Spigarelli et al. | 358/101 |
| 4,978,224 A | 12/1990 | Kishimoto et al. | 356/394 |
| 4,989,082 A | 1/1991 | Hopkins | 358/101 |
| 4,999,785 A | 3/1991 | Schmuter | 364/507 |
| 5,003,692 A | 4/1991 | Izumi et al. | 29/834 |

(Continued)

FOREIGN PATENT DOCUMENTS

EP  0 664 666 B1  8/1997

(Continued)

OTHER PUBLICATIONS

Notification of Transmittal of The International Search Report and Written Opinion of the International Searching Authority for application No. PCT/US2004/036238, filed Oct. 29, 2004.

(Continued)

*Primary Examiner*—Minh Trinh
(74) *Attorney, Agent, or Firm*—Christopher R. Christenson; Westman, Champlin & Kelly, P.A.

(57) ABSTRACT

Embodiments of the present invention improve upon component level inspection performed by pick and place machines. Such improvements include using a position sensitive device that measures the position of the placement head relative to the workpiece as the placement head travels towards and away from the workpiece during a placement cycle. The output of this sensor is used to selectably trigger the acquisition of the images used to measure a placement characteristic of the component placement machine.

4 Claims, 4 Drawing Sheets

U.S. PATENT DOCUMENTS

| | | | | |
|---|---|---|---|---|
| 5,023,916 A | 6/1991 | Breu | | 382/8 |
| 5,060,366 A | 10/1991 | Asai et al. | | 29/739 |
| 5,086,559 A | 2/1992 | Akatsuchi | | 29/834 |
| 5,105,149 A | 4/1992 | Tokura | | 324/158 |
| 5,129,725 A | 7/1992 | Ishizuka et al. | | 356/617 |
| 5,134,665 A | 7/1992 | Jyoko | | 382/8 |
| 5,194,791 A | 3/1993 | Cull | | 318/568.1 |
| 5,235,316 A | 8/1993 | Qualizza | | 340/436 |
| 5,237,622 A | 8/1993 | Howell | | 382/8 |
| 5,249,349 A | 10/1993 | Kuinose et al. | | 29/721 |
| 5,298,977 A | 3/1994 | Shintani et al. | | 356/376 |
| 5,336,935 A | 8/1994 | Shitanda et al. | | 307/116 |
| 5,377,405 A | 1/1995 | Sakurai et al. | | 29/833 |
| 5,383,270 A | 1/1995 | Iwatsuka et al. | | 29/840 |
| 5,384,956 A | 1/1995 | Sakurai et al. | | 29/834 |
| 5,392,360 A | 2/1995 | Weindelmayer et al. | | 382/8 |
| 5,450,204 A * | 9/1995 | Shigeyama et al. | | 356/601 |
| 5,461,480 A | 10/1995 | Yamada et al. | | 256/394 |
| 5,467,186 A | 11/1995 | Indo et al. | | 356/150 |
| 5,471,310 A | 11/1995 | Spigarelli et al. | | 356/399 |
| 5,495,424 A | 2/1996 | Tokura | | 364/507 |
| 5,537,204 A | 7/1996 | Woodhouse | | 356/243.1 |
| 5,541,834 A | 7/1996 | Tomigashi et al. | | 364/167.01 |
| 5,550,583 A | 8/1996 | Amir et al. | | 348/126 |
| 5,566,447 A | 10/1996 | Sakurai | | 294/832 |
| 5,589,942 A | 12/1996 | Gordon | | 356/611 |
| 5,598,345 A | 1/1997 | Takura | | 364/489 |
| 5,619,328 A | 4/1997 | Sakurai | | 356/375 |
| 5,627,913 A | 5/1997 | Spigarelli et al. | | 382/151 |
| 5,660,519 A | 8/1997 | Ohta et al. | | 414/783 |
| 5,686,994 A | 11/1997 | Tokura | | 356/394 |
| 5,719,952 A | 2/1998 | Rooks | | 382/150 |
| 5,724,722 A | 3/1998 | Hashimoto | | 29/740 |
| 5,739,846 A | 4/1998 | Gieskes | | 348/87 |
| 5,745,241 A | 4/1998 | Hashimoto | | 356/384 |
| 5,749,142 A | 5/1998 | Hanamura | | 29/833 |
| 5,754,677 A | 5/1998 | Kawada | | 382/141 |
| 5,835,133 A | 11/1998 | Moreton et al. | | 348/49 |
| 5,839,186 A | 11/1998 | Onodera | | 29/720 |
| 5,878,151 A | 3/1999 | Tang et al. | | 382/103 |
| 5,903,353 A | 5/1999 | Raymond | | 356/620 |
| 5,908,282 A | 6/1999 | Onodea | | 414/783 |
| 5,912,984 A | 6/1999 | Michael et al. | | 382/149 |
| 5,949,681 A | 9/1999 | Asai et al. | | 700/113 |
| 5,956,149 A | 9/1999 | Suzuki et al. | | 356/375 |
| 5,969,820 A | 10/1999 | Yoshii et al. | | 356/375 |
| 5,982,927 A | 11/1999 | Koljonen | | 382/168 |
| 6,027,019 A | 2/2000 | Kou | | 235/375 |
| 6,047,084 A | 4/2000 | Kent et al. | | 382/147 |
| 6,198,529 B1 | 3/2001 | Clark et al. | | 356/237.5 |
| 6,223,425 B1 | 5/2001 | Asai et al. | | 29/740 |
| 6,240,633 B1 | 6/2001 | Kent et al. | | 29/832 |
| 6,286,202 B1 | 9/2001 | Asai et al. | | 39/740 |
| 6,317,972 B1 | 11/2001 | Asai et al. | | 29/740 |
| 6,332,536 B2 | 12/2001 | Easton | | 206/459.5 |
| 6,334,840 B1 | 1/2002 | Asai et al. | | 483/1 |
| 6,408,090 B1 | 6/2002 | Salomon et al. | | 382/145 |
| 6,506,614 B1 | 1/2003 | Strassmann | | 438/7 |
| 6,522,777 B1 | 2/2003 | Paulsen et al. | | 382/154 |
| 6,538,244 B1 | 3/2003 | Skunes | | 250/208.1 |
| 6,538,750 B1 | 3/2003 | Fishbaine et al. | | 356/614 |
| 6,549,647 B1 | 4/2003 | Skunes et al. | | 382/150 |
| 6,608,320 B1 | 8/2003 | Skunes et al. | | 250/559.19 |
| 6,616,263 B2 | 9/2003 | Allen et al. | | 347/19 |
| 6,622,054 B1 | 9/2003 | Okuda et al. | | 700/51 |
| 6,681,151 B1 | 1/2004 | Weinzimmer et al. | | 700/259 |
| 6,738,505 B1 | 5/2004 | Prince | | 382/150 |
| 6,748,649 B2 * | 6/2004 | Okuda et al. | | 29/740 |
| 6,762,847 B2 | 7/2004 | Durquette et al. | | 356/614 |
| 6,778,878 B1 | 8/2004 | Kou | | 700/221 |
| 6,801,652 B1 | 10/2004 | Stanzl et al. | | 382/147 |
| 6,807,725 B2 | 10/2004 | Asai et al. | | 29/740 |
| 6,891,967 B2 | 5/2005 | Prince | | 382/150 |
| 6,966,235 B1 | 11/2005 | Paton | | 73/865.9 |
| 7,083,082 B2 | 8/2006 | Byskov et al. | | 235/375 |
| 2001/0040117 A1 | 11/2001 | Easton | | 206/714 |
| 2002/0014003 A1 | 2/2002 | Asai et al. | | 29/740 |
| 2002/0031279 A1 | 3/2002 | Shimizu | | 382/291 |
| 2002/0053133 A1 | 5/2002 | Suhara et al. | | 29/700 |
| 2002/0069395 A1 | 6/2002 | Fujiwara et al. | | 716/4 |
| 2002/0078580 A1 | 6/2002 | Haugen et al. | | 33/533 |
| 2002/0099466 A1 | 7/2002 | Diggin et al. | | 700/121 |
| 2002/0112064 A1 | 8/2002 | Eastvold | | 703/230 |
| 2002/0124391 A1 | 9/2002 | Kawai et al. | | 29/739 |
| 2002/0133940 A1 | 9/2002 | Kadomatsu et al. | | 29/832 |
| 2002/0143423 A1 | 10/2002 | Huber et al. | | 700/121 |
| 2003/0027363 A1 | 2/2003 | Kodama | | 438/14 |
| 2003/0029033 A1 | 2/2003 | Hidese et al. | | 29/833 |
| 2003/0098426 A1 | 5/2003 | Hayata | | 250/559.34 |
| 2003/0110610 A1 | 6/2003 | Duquette et al. | | 29/407.09 |
| 2003/0159515 A1 | 8/2003 | Tonomura | | 73/584 |
| 2003/0219330 A1 | 11/2003 | Lyndaker et al. | | 414/411 |
| 2003/0225547 A1 | 12/2003 | Paradies | | 702/150 |
| 2004/0094594 A1 | 5/2004 | Liebeke | | 226/32 |
| 2004/0119987 A1 | 6/2004 | Madsen et al. | | 356/614 |
| 2004/0163243 A1 | 8/2004 | Noda et al. | | 29/834 |
| 2004/0186616 A1 | 9/2004 | Overman et al. | | 700/224 |
| 2005/0115060 A1 | 6/2005 | Kondo | | 29/650 |
| 2005/0123187 A1 | 6/2005 | Bushman et al. | | 382/141 |
| 2005/0125993 A1 | 6/2005 | Madsen et al. | | 29/739 |
| 2005/0161498 A1 | 7/2005 | Byskov et al. | | 235/376 |
| 2005/0210832 A1 | 9/2005 | Tassin et al. | | 53/396 |
| 2005/0268460 A1 | 12/2005 | Case | | 29/833 |
| 2005/0276464 A1 | 12/2005 | Duquette et al. | | 382/151 |
| 2006/0016066 A1 | 1/2006 | Gaida et al. | | 29/740 |
| 2006/0075631 A1 | 4/2006 | Case et al. | | 29/709 |
| 2006/0174480 A1 | 8/2006 | Kawada | | 29/833 |

FOREIGN PATENT DOCUMENTS

| | | |
|---|---|---|
| EP | 0 948 250 | 10/1999 |
| EP | 0 959 654 | 11/1999 |
| EP | 1 152 604 | 11/2001 |
| EP | 1 343 363 | 9/2003 |
| GB | 2 317 496 | 3/1998 |
| JP | 62298750 | 12/1987 |
| JP | 63090707 | 4/1988 |
| JP | 01309190 | 12/1989 |
| JP | 02076080 | 3/1990 |
| JP | 02235399 | 9/1990 |
| JP | 5-37918 | 2/1993 |
| JP | 6-249629 | 9/1994 |
| JP | 6-249630 | 9/1994 |
| JP | 6-310899 | 11/1994 |
| JP | 07183697 | 7/1995 |
| JP | 7-77319 | 8/1995 |
| JP | 7-336099 | 12/1995 |
| JP | 8032291 | 2/1996 |
| JP | 8-111598 | 4/1996 |
| JP | 9-021609 | 1/1997 |
| JP | 9-023097 | 1/1997 |
| JP | 9-205299 | 8/1997 |
| JP | 9-210626 | 8/1997 |
| JP | 9-214198 | 8/1997 |
| JP | 9-223898 | 8/1997 |
| JP | 9-246799 | 9/1997 |
| JP | 10136962 | 5/1998 |
| JP | 9-293998 | 9/1999 |
| JP | 11285925 | 10/1999 |
| JP | 2000-022392 | 1/2000 |
| JP | 2000349499 (A) | 12/2000 |
| JP | 2001-165860 | 6/2001 |
| JP | 2001-168600 | 6/2001 |
| JP | 2001168594 | 6/2001 |

| | | |
|---|---|---|
| JP | 2002271099 | 9/2002 |
| JP | 2003-092495 | 3/2003 |
| JP | 2003152392 | 5/2003 |
| JP | 2003-243898 | 8/2003 |
| JP | 2003243899 | 8/2003 |
| JP | 2003-304095 | 10/2003 |
| JP | 2005285840 | 10/2005 |
| WO | EP 0 932 331 A1 | 7/1999 |
| WO | WO 00/19794 | 4/2000 |
| WO | WO 00/19800 | 4/2000 |
| WO | WO 00/26640 | 5/2000 |
| WO | WO 01/67831 A2 | 9/2001 |
| WO | WO 02/29357 | 4/2002 |
| WO | WO 03/043400 A1 | 5/2003 |

OTHER PUBLICATIONS

International Search-Report and Written Opinion from application No. PCT/US05/017425, filed May 18, 2005; Notification of the Transmittal of the International Preliminary Report from application No. PCT/US05/017425, filed May 18, 2005.

International Search Report from Appln No. PCT/US2004/036683, filed Nov. 3, 2004; International Preliminary Report on Patentability from Application No. PCT/US2004/036683, filed Nov. 3, 2004.

The International Search Report from Appln No. PCT/US/2002/36154, filed Nov. 11, 2002.

The International Preliminary Report on Patentability from Appln No. PCT/US/2005/35985, filed Oct. 5, 2005; International Search Report and Written Opinion from Appln No. PCT/US/2005/35985, filed Oct. 5, 2005.

The International Preliminary Report on Patentability for foreign application No. PCT/US2004/036238 filed Oct. 29, 2004.

Chinese Office Action from Application No. 02826679.X, filed Nov. 12, 2002.

The Notification of Transmittal of International Preliminary Examination Report in foreign application No. 2005/025905, filed Jul. 21, 2005.

International Search Report and Written Opinion from foreign application No. 2005/025905, filed Jul. 21, 2005.

International Preliminary Report on Patentability in foreign application No. 2004/036704, filed Nov. 3, 2004.

Notification of Transmittal of International Search Report and Written Opinion of the International Searching Authority in foreign application No. 2004/036704, filed Nov. 3, 2004.

* cited by examiner

PICK AND PLACE MACHINE WITH IMPROVED COMPONENT PLACEMENT INSPECTION

CROSS-REFERENCE TO RELATED APPLICATIONS

The present application is based on and claims the benefit of U.S. provisional patent application Ser. No. 60/517,184, filed Nov. 4, 2003, the content of which is hereby incorporated by reference in its entirety.

COPYRIGHT RESERVATION

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

Pick and place machines are generally used to manufacture electronic circuit boards. A blank printed circuit board is usually supplied to the pick and place machine, which then picks electronic components from component feeders, and places such components upon the board. The components are held upon the board temporarily by solder paste, or adhesive, until a subsequent step in which the solder paste is melted or the adhesive is fully cured.

Pick and place machine operation is challenging. Since machine speed corresponds with throughput, the faster the pick and place machine runs, the less costly the manufactured board will be. Additionally, placement accuracy is extremely important. Many electrical components, such as chip capacitors and chip resistors are relatively small and must be accurately placed on equally small placement locations. Other components, while larger, have a significant number of leads or conductors that are spaced from one another at a relatively fine pitch. Such components must also be accurately placed to ensure that each lead is placed upon the proper pad. Thus, not only must the machine operate extremely fast, but it must also place components extremely accurately.

In order to enhance the quality of board manufacture, fully or partially populated boards are generally inspected after the placement operation(s), both before and after solder reflow, to identify components that are improperly placed or missing or any of a variety of errors that may occur. Automatic systems that perform such operation(s) are highly useful because they help identify component placement problems prior to solder reflow. This allows substantially easier rework and/or the identification of defective boards after reflow that are candidates for rework. One example of such a system is sold under the trade designation Model KS Flex available from CyberOptics Corporation of Golden Valley, Minn. This system can be used to identify such problems as alignment and rotation errors; missing and flipped components; billboards; tombstones; component defects; incorrect polarity; and wrong components.

Identification of errors pre-reflow provides a number of advantages. Rework is easier; closed-loop manufacturing control is facilitated; and less work in-process exists between error generation and remedy. While such systems provide highly useful inspection, they do consume plant floor-space as well as programming time and maintenance efforts.

One relatively recent attempt to provide the benefits of after-placement inspection located within and pick a place machine itself is disclosed in U.S. Pat. No. 6,317,972 to Asai et al. That reference reports a method for mounting electric components where an image of a mounting location is obtained prior to component placement, and compared with an image of the mounting location after component placement to inspect the placement operation at the component level.

While the disclosure of Asai et al. marks one attempt to employ in-machine component level inspection, there remains much work to be done. For example, the disclosure of Asai et al. teaches acquiring two images, before and after the placement of the component at exactly the same time in the placement cycle. While this approach is useful for determining the absence or presence of a component after placement, there are several practical problems in the approach. First, image acquisition is very important and requires precise timing control to align the images to proper time slots. Secondly, even if predetermined triggers of the image acquisitions result in aligned images, there are sometimes requirements that the trigger be adjusted to optimize the acquisition timing to the particular part or placement location on the board. Additionally, depending on the measurement required, the relative timing of the image acquisition may require adjusting during the normal cycling of the machine.

To increase the viability of component level placement inspection in a pick and place machine, it would be advantageous to improve aspects of the image acquisition timing, allowing images to be acquired at predetermined times relative to the placement cycle and to allow the image acquisition timing to be changed on-the-fly using software commands. This would allow the optimal timing to be used for each of the placements.

In addition to the timing aspects of the pick and place machine, the actual placement cycle of a component may not be regular. If a component is not properly recognized by the component alignment camera or if the component is not present on the nozzle during the operation of a turret style pick and place machine, the placement cycle is skipped and the component is repicked at later time in the placement cycle. When this operation occurs, the placement inspection device should determine if the lack of component after placement is due to a planned non placement or an actual misplaced component.

SUMMARY OF THE INVENTION

Embodiments of the present invention improve upon component level inspection performed by pick and place machines. Such improvements include using a position sensitive device that measures the position of the placement head relative to the workpiece as the placement head travels towards and away from the workpiece during a placement cycle. The output of this sensor is used to selectably trigger the acquisition of the images used to measure a placement characteristic of the component placement machine.

In one embodiment, a linear position sensing device is attached to the nozzle of a placement head to determine the vertical position of the placement head and the signal is sent to the image acquisition device to trigger the acquisitions.

In another embodiment, the control signal of the placement head is used to determine the placement position of the head and that signal is used to trigger the image acquisition system.

In yet another embodiment, a rotary position sensing device is attached to the drive mechanisms of a turret placement machine and the rotary position of the drive shaft is used to detect the correct timing of the image acquisition system.

Using the output of this sensor, the position and timing of the image acquisition can be adjusted externally from the machine and on a regular basis during the regular operation of the machine.

In another embodiment, a proximity sensor is used in conjunction with the position sensor to determine if a part is going to be placed or if the placement cycle is a known non-placement.

DETAILED DESCRIPTION OF ILLUSTRATIVE EMBODIMENTS

Figure 1:
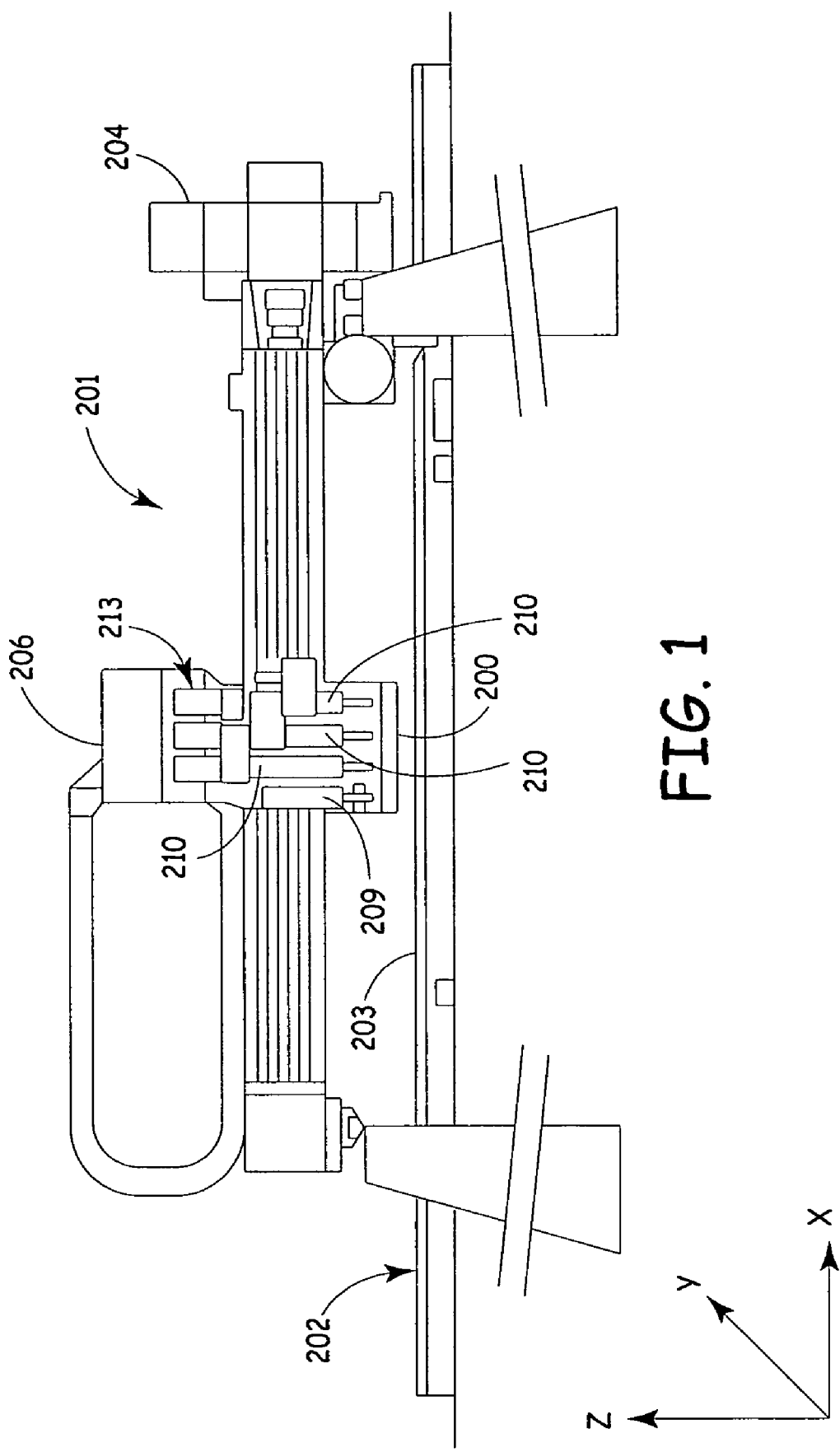
FIG. 1 is a diagrammatic view of a Cartesian pick and place machine with which embodiments of the invention can be practiced.

FIG. 1 is a diagrammatic view of an exemplary Cartesian pick and place machine 201 with which embodiments of the present invention are applicable. Pick and place machine 201 receives a workpiece, such as circuit board 203, via transport system or conveyor 202. A placement head 206 then obtains one or more electrical components to be mounted upon workpiece 203 from component feeders (not shown) and undergoes relative motion with respect to the workpiece in x, y and z directions to place the component in the proper orientation at the proper location upon workpiece 203. The relative motion can be generated by moving the placement head; moving the workpiece; or a combination thereof. Placement head 206 may include an alignment sensor 200 that passes under components held by nozzles 208, 210, 212 as placement head 206 moves the component(s) from pickup locations to placement locations. Sensor 200 allows placement machine 201 to view undersides of components held by nozzles 208, 210, 212 such that component orientation and, to some degree, component inspection can be effected while the component is being moved from the component pick-up location to the placement location. Other pick and place machines may employ a placement head that moves over a stationary camera to image the component. Placement head 206 may also include a downwardly-looking camera 209 which is generally used to locate fiducial marks upon workpiece 203 such that the relative location of placement head 206 with respect to workpiece 203 can be readily calculated.

Figure 2A:
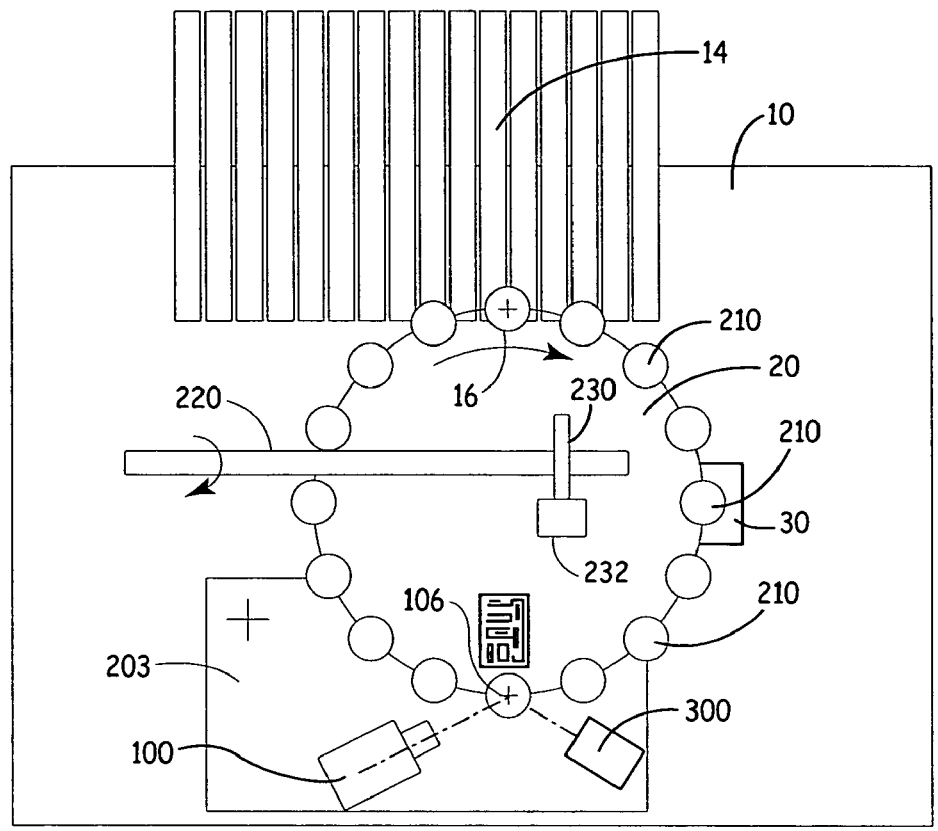
FIG. 2a is a diagrammatic plan view of a turret pick and place machine with which embodiments of the invention can be practiced.
Figure 2B:
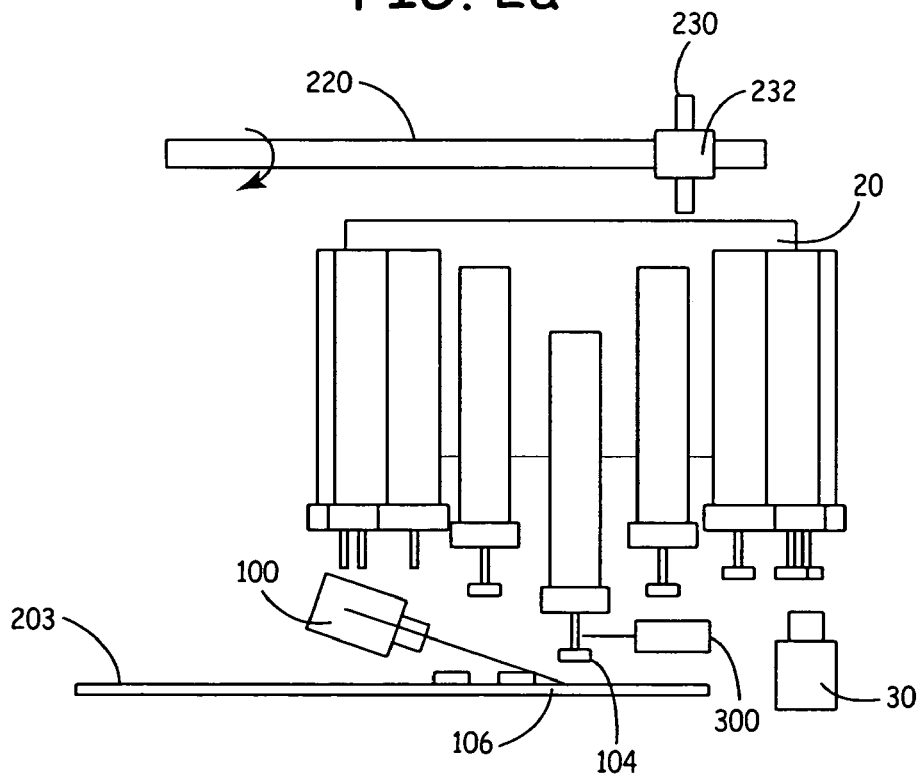
FIG. 2b is a diagrammatic front view of a turret pick and place machine with which embodiments of the invention can be practiced.

FIG. 2 is a diagrammatic view of an exemplary rotary turret pick and place machine 10 with which embodiments of the present invention are applicable. For the turret pick and place machine 10, the workpiece 203 is loaded via a conveyor onto an x-y stage (not shown). Placement nozzles 210 are attached to the main turret 20 and are disposed at regular angular intervals around the rotating turret. During each pick and placement cycle, the turret indexes an angular distance equal to the angular distance between adjacent placement nozzles 210. After the turret rotates into position and the workpiece 203 is positioned by the x-y stage, a placement nozzle 210 obtains a component 104 from a component feeder 14 at a pre-defined pick point 16. During this same interval, another nozzle 210 places another component 104 onto the workpiece 203 at a preprogrammed placement location 106. Additionally, while the turret 20 pauses for the pick and place operation, an upward-looking camera 30 acquires an image of another component 104, which provides alignment information for that component. This alignment information is used by the pick and place machine 10 to position the workpiece 203 when the corresponding placement nozzle is positioned several steps later to place the component. After the pick and place cycle is complete, turret 20 indexes to the next angular position and workpiece 203 is repositioned in the x-y direction to move the placement location to a position that corresponds to the placement location 106.

Figure 3:
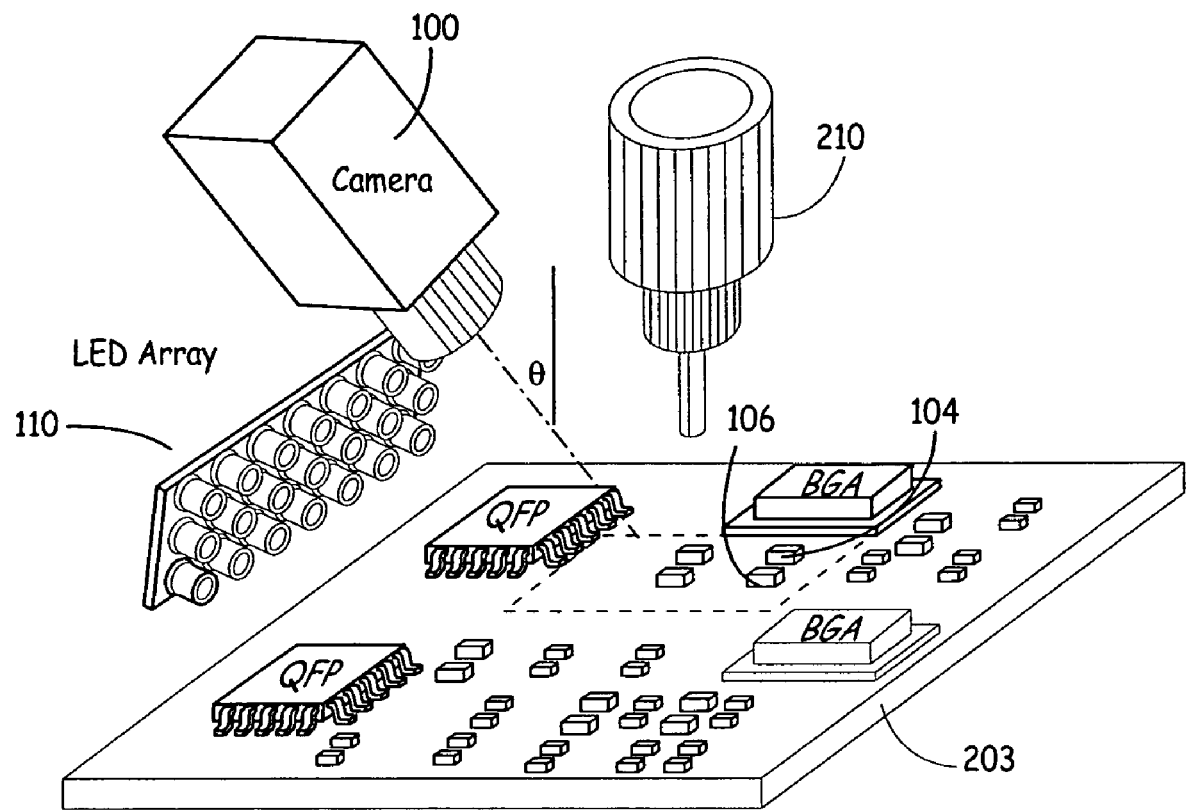
FIG. 3 is a simplified diagrammatic view of an image acquisition system aligned with the placement point of a component placement machine.
Figure 4A:
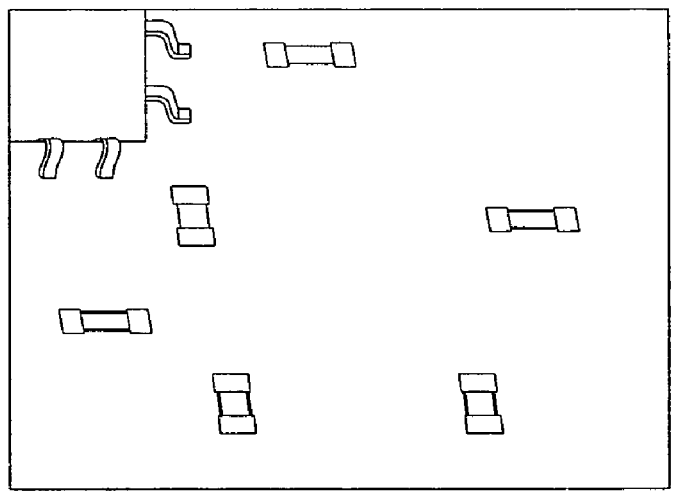
FIG. 4a is a diagrammatic image of a circuit board prior to component placement
Figure 4B:
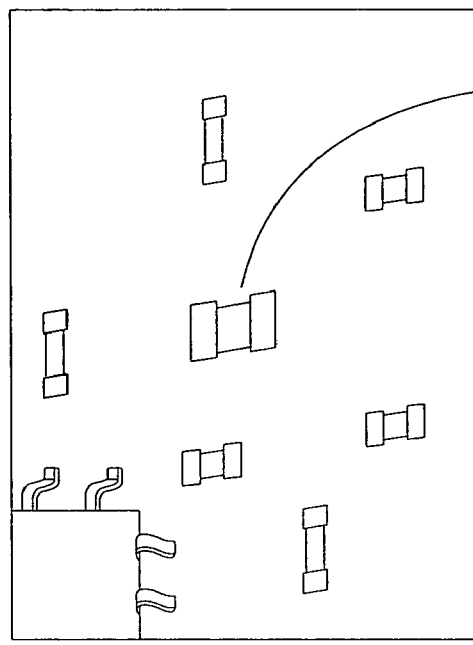
FIG. 4b is a diagrammatic image of a circuit board after a component placement.

FIG. 3 is a diagrammatic view of a placement head in accordance with embodiments of the present invention. FIG. 3 illustrates an image acquisition device 100 disposed to acquire images of placement location 106 of component 104 before and after component 104 is deposited by nozzle 210 upon location 106. Device 100 obtains images of placement location 106 on workpiece 203 prior to placement of component 104 as shown in FIG. 4a, and then shortly thereafter as shown in FIG. 4b. A comparison of these before and after images facilitates component-level placement inspection and verification. Since acquisition of images of the placement location is generally done when the nozzle, such as nozzle 210, holds the component 104 above the placement location, it is important to be able to image placement location 106 while minimizing or reducing interference from the component itself or adjacent components which may be already mounted upon the workpiece. Thus, it is preferred that the device 100 employs an optical axis allowing views that are inclined at an angle θ with respect to the plane of workpiece 203. It is also important to precisely time the image acquisition interval such that the workpiece 203 and the placement nozzle 210 are relatively aligned with each other and the component is high enough above workpiece 203 to visualize workpiece 203 from the camera angles. After component 104 is placed, the second image should be timed properly to acquire an image after nozzle 210 has retracted sufficiently to allow a view of the placed component 104 and before workpiece 203 has started to move to the next placement location.

Embodiments of the present invention generally obtain two or more successive images of the intended placement location (i.e. before placement and after). Since placement occurs relatively quickly, and since slowing machine throughput is extremely undesirable, it is sometimes necessary to acquire two successive images very quickly since cessation of the relative motion between the placement head and the board is fleeting. For example, it may be necessary to acquire two images within a period of approximately 10 milliseconds.

In accordance with various aspects of the present invention, rapid acquisition of multiple successive images can be done in different ways. One way is using commercially available CCD devices and operating them in a non-standard manner to acquire images at a rate faster than can be read from the device. Further details regarding this image acquisition technique can be found in U.S. Pat. No. 6,549,647, assigned to the Assignee of the present invention. Yet another way to rapidly acquire multiple success in images is to use multiple CCD arrays arranged to view the intended placement location through common optics.

In order for a vision system to capture images of the placement of electronic components on workpiece 203, the vision system should image the workpiece 203 before and after the placement event. The signals that trigger the before and after can be provided by the machine placing the components. These signals are stable and repeatable for each placement relative to the placement timing.

Figure 5:
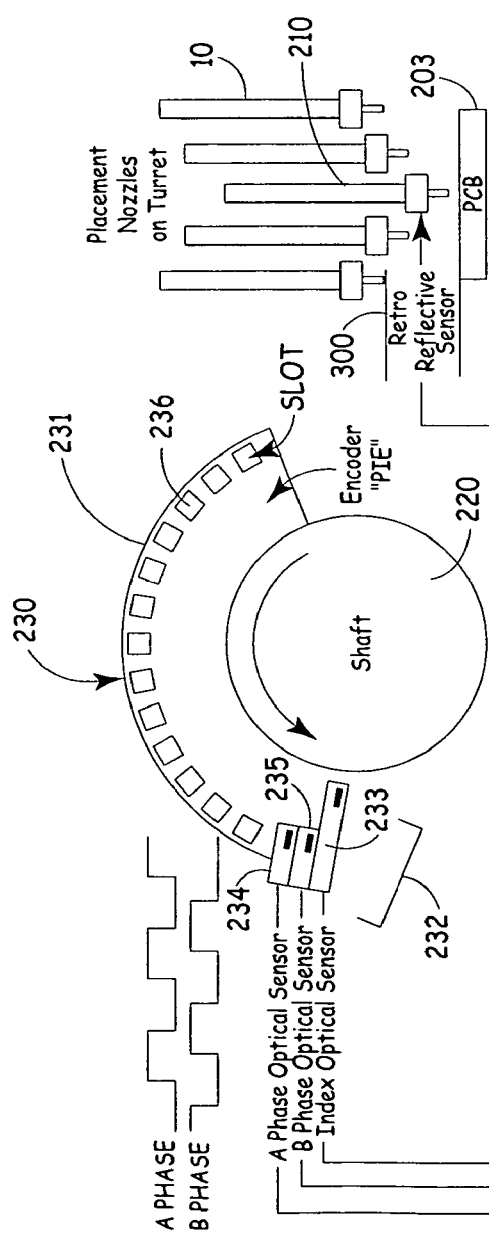
FIG. 5 is a block diagram of a pick and place machine in accordance with an embodiment of the present invention.
Figure 5:
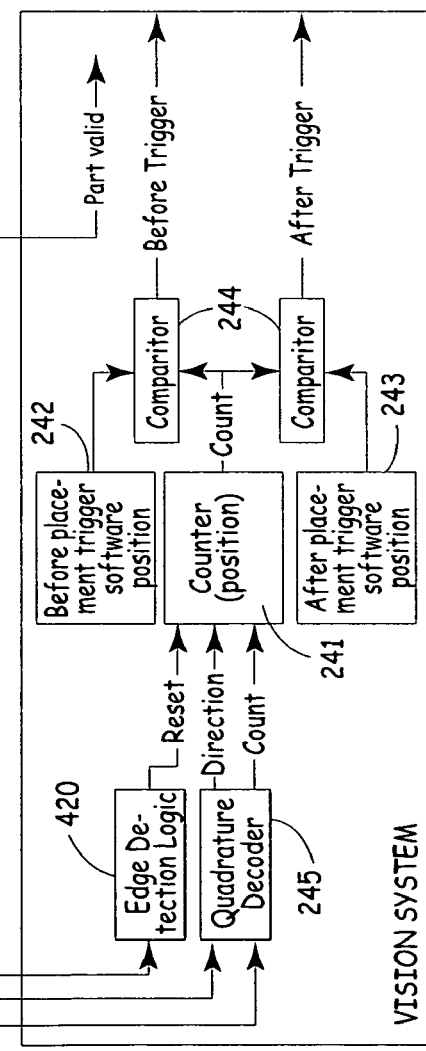

FIG. 5 is a diagrammatic view of a turret style pick and place machine in accordance with an embodiment of the present invention. For turret style pick and place machine 10 these triggers can be derived by attaching rotary encoder device 230 on a shaft 220 present in the machine that rotates 360° per placement. Thus, in this embodiment, encoder device 230 consists of a mechanical disk 231 with slots 236 at its circumference attached to rotating shaft 220. Two optical sensors 234, 235 are attached to a stationary portion of machine 10 to detect slots 236 in disk 231. The size and number of slots 236 on disk 231 as well as the positioning of optical sensors 234, 235 preferably generates two square waves whose phase is 90° offset from one another. This allows vision system 240 to derive the position and direction of rotation of shaft 220 through quadrature 245 decoding of optical sensors 234, 235. A counter 241 is used to keep track of the position of shaft 220 in vision system 240. Because the two triggers are typically a few tens of degrees apart, disk 231 does not need to be a full 360°, but could be "pie" shaped with the angle of the pie covering the before and after placement events. A third sensor 233, optically aligned to detect the leading or trailing edge of the pie and not slots 236, can be used as an index signal to reset positional counter 241 once per revolution. An advantage of the pie-shaped encoder disk is that it is easier to manufacture and install versus a full 360° disk that would have to be made in two pieces to install over an existing shaft 220.

As shaft 220 rotates in operation, the solid portion of pie encoder 231 blocks optical index sensor 233 and edge detection logic 246 causes a reset of position counter 241. As shaft 220 rotates further, optical quadrature sensors 234, 235 increment positional counter 241. The resolution of the encoder position is four counts per slot 236 in disk 231.

Vision system 240 is programmed with the desired shaft positions 242, 243, that represent the position in the placement cycle in which to trigger the before and after images. When positional counter 241 equals either of the before or after programmed positions 242, 243, vision system 240 recognizes the event using comparator circuit 244 and acquires the image. Using a software interface, the trigger positions can be adjusted, which eliminates the need to mechanically adjust encoder disk 231 once installed on shaft 220. If there is some backlash or tolerance of position between the shaft 220 and placement turret 20, then the angle of the pie can be made greater by that tolerance to ensure that the position of interest is included in the pie angle with no mechanical adjustments. Additionally, for different component sizes, there may be a different optimal trigger point within the cycle to acquire images. Using embodiments of the invention as described above, the trigger points can be changed between placement cycles to optimize the trigger points for each component.

For Cartesian pick and place machines 201, each nozzle 210 typically has an integrated encoder 213 disposed to determine the z position of the placement nozzle. In these cases, the output of the encoder 213 is used as input to the vision system 240. For controlling the z motion of placement nozzle 210, encoders 213 are either rotary encoders disposed to measure the position of the drive shaft or a linear encoder disposed to measure the vertical position of placement nozzle 210. Since the placement nozzle in a Cartesian machine travels in both directions during a placement cycle, the comparator also needs to determine which direction nozzle 210 is traveling to differentiate between the before placement image acquisition timing that occurs during the initial downward stroke of the nozzle and the after placement image acquisition timing that occurs during the upward stroke of the nozzle. Other than the addition of a direction signal, the operation of the timing of the vision system 240 is identical to the turret machine described above.

To further enhance the performance of vision system 240, it is desirable to identify those before and after images where the turret pick and place machine 10 is not actively attempting a part placement. This situation typically occurs when part alignment camera 30 recognizes that there is no part present or the wrong part present on placement nozzle 210. In this situation, turret 20 and shaft 220 are still rotating, but there is no component on nozzle 210 to be placed or the component is the wrong type. When nozzle 210 reaches placement position 106, machine 10 does not move nozzle 210 down towards workpiece 203 to attempt component placement. If this non-placement were not recognized by vision system 240, vision system 240 would report an error in placement when the non-placement was not an actual error. This condition is known as a false negative. By mounting a retro-reflective optical sensor 300 to a fixed portion of the pick and place machine disposed to be focused on a mechanical feature of placement nozzle 210, vision system 240 can infer if nozzle 210 did not move down to attempt a placement. If nozzle 210 does move down to place a component, retro-reflective sensor 300 detects this final motion and sends a part valid signal to vision system 240. A negative part valid signal from sensor 300 indicates to vision system 240 that the next placement cycle can be ignored.

There are several methods that can be deployed to determine the placement valid signal. They include but are not limited to: attaching a vane to the nozzle and detecting the position of the vane using a opto-interrupter sensor; electrically detecting the part valid signal used to control the operation of the head motion; detecting the actuation of the mechanism used to drive the nozzle in the vertical motion towards the workpiece; and monitoring the part valid signal generated by the part alignment vision system.

Although the present invention has been described with reference to preferred embodiments, workers skilled in the art will recognize that changes may be made in form and detail without departing from the spirit and scope of the invention.

What is claimed is:

1. A pick and place machine for placing a component upon a workpiece, the machine comprising:
    a placement head configured to undergo relative motion with respect to the workpiece having at least one nozzle for releasably holding the component;
    an image acquisition device coupled to the placement head disposed to acquire at least one image of a placement location on the workpiece of the component, wherein the image acquisition device employs an optical axis that is inclined relative to a plane of the workpiece; and
    a position sensing device disposed to provide an output indicative of the position of the placement head relative to the workpiece;
    wherein the position sensing device is a rotary encoder coupled to a shaft of the pick and place machine that rotates 360 degrees per placement and wherein the position sensing device output is used to determine the timing of at least one image acquisition.

2. The machine of claim 1, wherein the rotary encoder is a semi-circle shape.

3. The machine of claim 1, wherein the rotary encoder further comprises of an index sensor.

4. A pick and place for placing a component upon a workpiece, the machine comprising:

a placement head configured to undergo relative motion with respect to the workpiece having at least one nozzle for releasably holding the component;

an image acquisition device coupled to the placement head disposed to acquire at least one image of a placement location on the workpiece of the component, wherein the image acquisition device employs an optical axis that is inclined relative to a plane of the workpiece; and a position sensing device disposed to provide an output indicative of the position of the placement head relative to the workpiece;

wherein the position sensing device output is used to determine the timing of at least one image acquisition and wherein the position sensing device is attached to a nozzle of the placement head to determine a vertical position of the nozzle.

* * * * *

UNITED STATES PATENT AND TRADEMARK OFFICE
CERTIFICATE OF CORRECTION

PATENT NO. : 7,559,134 B2
APPLICATION NO. : 10/970355
DATED : July 14, 2009
INVENTOR(S) : Gaida It is certified that error appears in the above-identified patent and that said Letters Patent is hereby corrected as shown below:

Page 3, column 1, line 8,

At Foreign Patent Documents, delete "WO   EP 0 932 331 A1   7/1999"
and insert --EP   EP 0 932 331 A1   7/1999--.

At column 7, line 7, delete "A pick and place for" and insert --A pick and place machine for--.

Signed and Sealed this

Twentieth Day of October, 2009

David J. Kappos
*Director of the United States Patent and Trademark Office*